United States Patent
Mendez et al.

(10) Patent No.: US 10,361,688 B2
(45) Date of Patent: Jul. 23, 2019

(54) ULTRASHORT HIGH POWER PULSE GENERATOR

(71) Applicant: The United States of America, as represented by the Secretary of the Navy, Washington, DC (US)

(72) Inventors: Victor M. Mendez, Washington, DC (US); Sun K. Hong, Terre Haute, IN (US); Jerry T. Kim, Washington, DC (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 15/452,287

(22) Filed: Mar. 7, 2017

(65) Prior Publication Data
US 2017/0257084 A1   Sep. 7, 2017

Related U.S. Application Data

(60) Provisional application No. 62/304,592, filed on Mar. 7, 2016.

(51) Int. Cl.
| | |
|---|---|
| *H03K 5/08* | (2006.01) |
| *G01S 7/282* | (2006.01) |
| *H01P 7/06* | (2006.01) |
| *H03K 5/07* | (2006.01) |

(52) U.S. Cl.
CPC ............... *H03K 5/08* (2013.01); *G01S 7/282* (2013.01); *H01P 7/06* (2013.01); *H03K 5/07* (2013.01)

(58) Field of Classification Search
USPC .......... 250/493.1; 359/124, 130, 136; 372/6; 385/14, 15, 16
See application file for complete search history.

(56) References Cited

U.S. PATENT DOCUMENTS

| | | | | |
|---|---|---|---|---|
| 6,314,115 B1 * | 11/2001 | Delfyett | ................. | H01S 5/065 370/378 |
| 6,614,950 B2 * | 9/2003 | Huang | ................. | G02B 6/4215 385/15 |

* cited by examiner

*Primary Examiner* — Kiet T Nguyen
(74) *Attorney, Agent, or Firm* — US Naval Research Laboratory; Richard F. Bis

(57) ABSTRACT

A method of generating a high-power Radio-Frequency ultrashort waveform comprising the steps of generating an input waveform at a relatively low power level from an impulse response characteristic of a reverberant cavity via one-bit quantization and time reversal; generating an amplified input waveform of a power higher than the input waveform via feeding the input waveform into one or more amplifiers; generating a compressed ultrashort pulse having a high power relative to the amplified input waveform via feeding the amplified input waveform into the reverberant cavity.

11 Claims, 5 Drawing Sheets

ULTRASHORT HIGH POWER PULSE GENERATOR

RELATED APPLICATIONS

This application claims the benefit of U.S. Provisional Application No. 62/304,592 filed Mar. 7, 2016, which is hereby incorporated herein by reference.

FIELD OF INVENTION

The present invention relates generally to RF pulses, and more particularly to generating ultrashort (sub-nanosecond) high-power microwave pulses via passive means.

BACKGROUND

There is interest in generating ultrashort, sub-nanosecond pulses that can be utilized in various areas such as directed energy, high resolution radar, wireless power transfer and biomedical applications. A conventional method for generating ultrashort pulse is pulse compression, which is a technique for converting a long duration, low amplitude waveform into a short high peak pulse. Pulse compression allows for significantly higher peak power to be generated from a source that is otherwise limited in peak power, which helps to improve size, weight, and power (SWaP) of the device. Pulse compression can be achieved actively or passively. An active pulse compression uses a resonant cavity with an embedded switch. Narrowband microwave energy is stored in this cavity at its corresponding resonant frequency. Once the switch is activated, a sudden shift in the resonances causes the release of the stored energy in the form of a short, high power pulse. A passive approach is to apply a dispersive waveguide such that the input waveform containing the inverse dispersion profile compresses into a short pulse.

SUMMARY OF INVENTION

However, limitations exist in the existing pulse compression methods for generating ultrashort RF pulses, due to their physical design constraints that confines the bandwidth, which are due to the switching speed and cavity (for resonance cavities) and to the dispersion rate (for dispersive waveguides).

An exemplary Ultrashort High Power Pulse Generator (USHPG) system, is a pulse compression system that overcomes the limitation present in the existing pulse compression techniques and is capable of generating ultrashort high power RF pulses. This system is based on the application of time-reversal techniques in a reverberant cavity.

According to one aspect of the invention, a method of generating a high-power Radio-Frequency ultrashort waveform comprising the steps of generating an input waveform at a relatively low power level from an impulse response characteristic of a reverberant cavity via one-bit quantization and time reversal; generating an amplified input waveform of a power higher than the input waveform via feeding the input waveform into one or more amplifiers; and generating a compressed ultrashort pulse having a high power relative to the amplified input waveform via feeding the amplified input waveform into the reverberant cavity.

Optionally, the method further includes the step of measuring an impulse response of the cavity to obtain the impulse response characteristic of the reverberant cavity.

Optionally, the input waveform is of uniform amplitude.

Optionally, the step of generating an input waveform comprises recording an impulse response from the reverberant cavity and modifying the impulse response to have uniform amplitude using one-bit time reversal, thereby generating the input waveform.

According to another aspect of the invention, an ultrashort high-power pulse generator includes a reverberant cavity assembly having an input port and output port each opening onto a hollow cavity defined by sidewalls of the assembly; an arbitrary waveform generator configured to record an impulse response from the reverberant cavity and modify the impulse response to have uniform amplitude using one-bit time reversal, thereby generating the input waveform; and one or more signal amplifiers configured to amplify the input signal generated by the arbitrary waveform generator and feed the amplified signal into the input port of the reverberant cavity assembly. The output port of the reverberant cavity assembly outputs the ultrashort high-power pulse.

Optionally, the reverberant cavity assembly is a semi-2D cavity.

Optionally, the reverberant cavity is configured to cause waves reverberate only in a plane parallel to a breadth of the hollow cavity and perpendicular to a thickness of the hollow cavity.

Optionally, dimensions of the hollow cavity ensure an overmoded condition across a bandwidth of the input waveform.

Optionally, the reverberant cavity assembly includes an X-shaped scatterer inside the hollow cavity configured as a modemixer.

The foregoing and other features of the invention are hereinafter described in greater detail with reference to the accompanying drawings.

DETAILED DESCRIPTION

Figure 1:
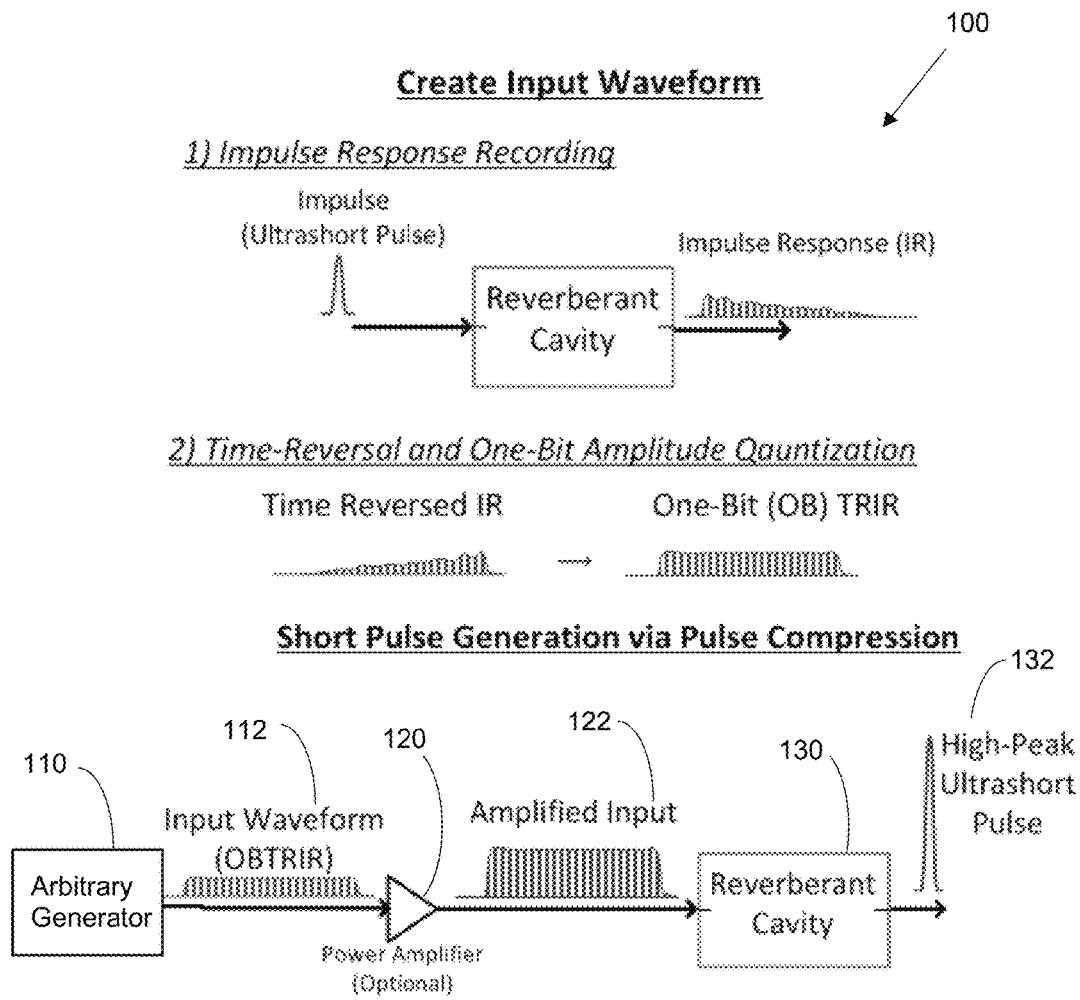
FIG. 1 shows a schematic diagram of the USHPG system and method.

An exemplary USHPG system 100 consists of three main components as illustrated in FIG. 1. The first component is an arbitrary waveform source 110 that generates a low power, long duration input waveform 112. The second component is a power amplifier 120 that amplifies the input waveform to moderate/high power level producing an amplified waveform 122. The third component is the pulse compressor 130 that produces a compressed ultrashort high peak power pulse 132 by compressing the amplified waveform.

The USHPG system is designed to cover an ultra-wide bandwidth ranging from L-band to Kuband (1-18 GHz), such that the output pulse can be as short as 60 picoseconds since the pulsewidth is inversely proportional to the bandwidth. The key to achieving such a wide bandwidth is the reverberant cavity that can support closely spaced eigenmodes over the entire frequency bandwidth of the design. Furthermore, what makes the pulse compression possible is the random phase distortion in the transfer function of the cavity. That is, the impulse response of the cavity is a slowly decaying, long duration waveform due to a large number of bounces on the reflecting walls. These bounces result in a set of distinct ray trajectories between the input and output ports of the cavity. Most ray trajectories have different path lengths, such that the impulse echo in each trajectory arrives at the output port with a different time delay, resulting in the time-spread impulse response. These time delays in the impulse response are responsible for the phase distortion in the transfer function.

Figure 2:
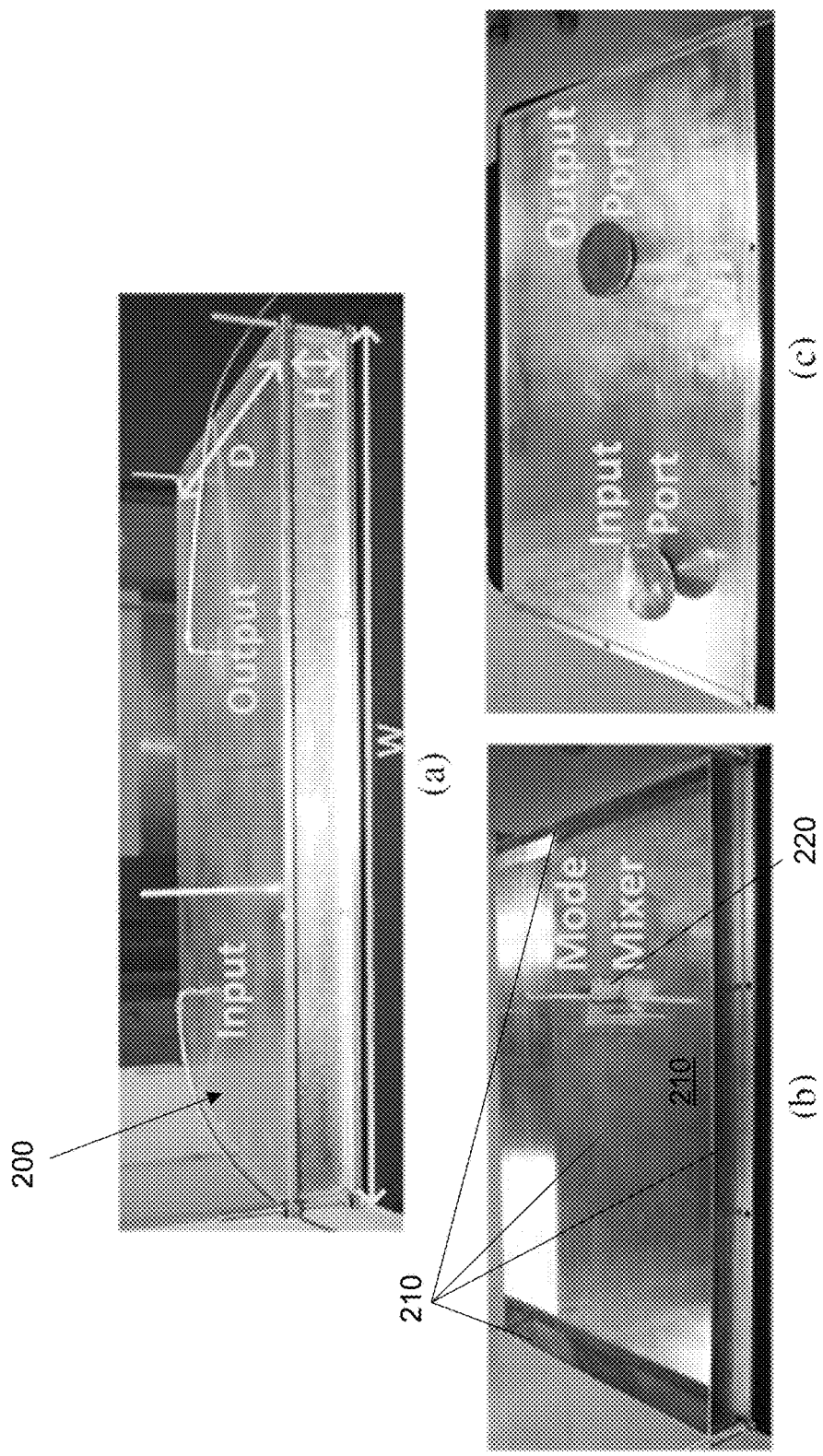
FIG. 2 shows an exemplary reverberant cavity with the overall exterior view (top, a), the cavity with the top plate off showing the inside (bottom left, b), and the interior part of the top plate showing the input and output ports (bottom right, c).

Referring now to FIG. 2, an experimental reverberant cavity assembly is shown at 200. The cavity assembly 200 consists of aluminum walls 210 defining a hollow cavity 212 and enclosing a scatterer 220 (mode mixed) to diversify the direction of the ray trajectories. An exemplary scatterer is x-shaped. The inner dimensions of the exemplary cavity are 0.58 m×0.32 m×0.04 m (W×D×H) with the corresponding volume of 0.0074 m$^3$. Such an exemplary cavity may cover a frequency range of 1-18 GHz. Other cavity dimensions may be used corresponding to different frequency ranges, and the one discussed herein is by example, only.

Figure 3:
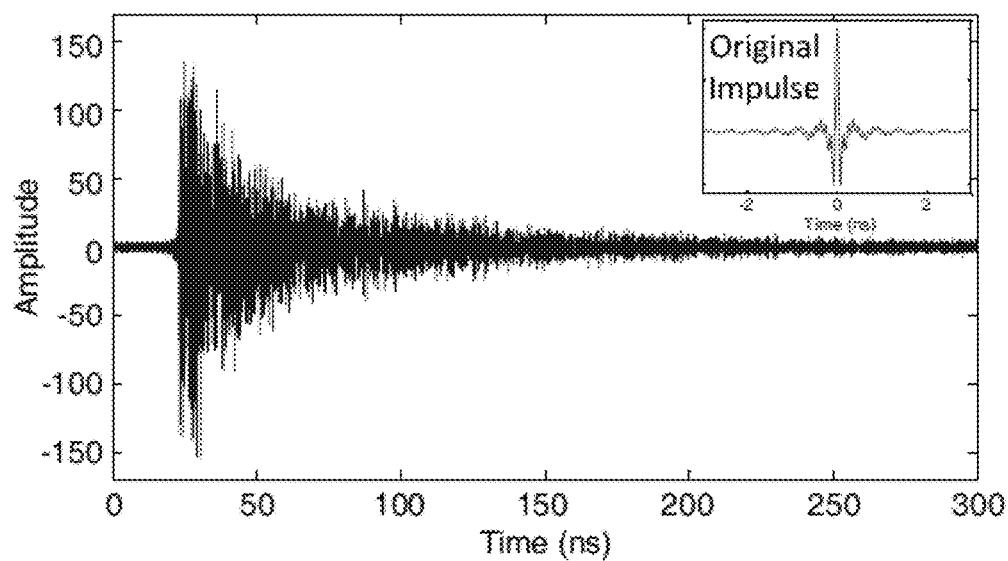
FIG. 3 shows an impulse response of the exemplary reverberant cavity with the original impulse plotted in the inset. The amplitude is scaled to an arbitrary unit for a data processing purpose.

In a test of this exemplary cavity, test frequency ranges were set at 2-9 GHz due to the limitation in the bandwidth of the arbitrary signal source used in the experiment. An impulse containing the corresponding bandwidth was generated and fed into the cavity. Experiments have been performed at low power levels and the results are described herein. The amplitude of the impulse was 250 mV. FIG. 3 shows the impulse response of the cavity measured at the output port (note that the amplitude h(t) of the plotted impulse response is scaled for processing purposes). In the frequency domain, h(t) is represented by a transfer function H(w) consisting of closely spaced eigenmodes with random phase distortion. This phase distortion is heavily dependent on the position of the ports and scatterers which determine the propagation condition. In this regard, a reverberant cavity can be viewed as a highly dispersive structure with a random phase response.

Figure 4:
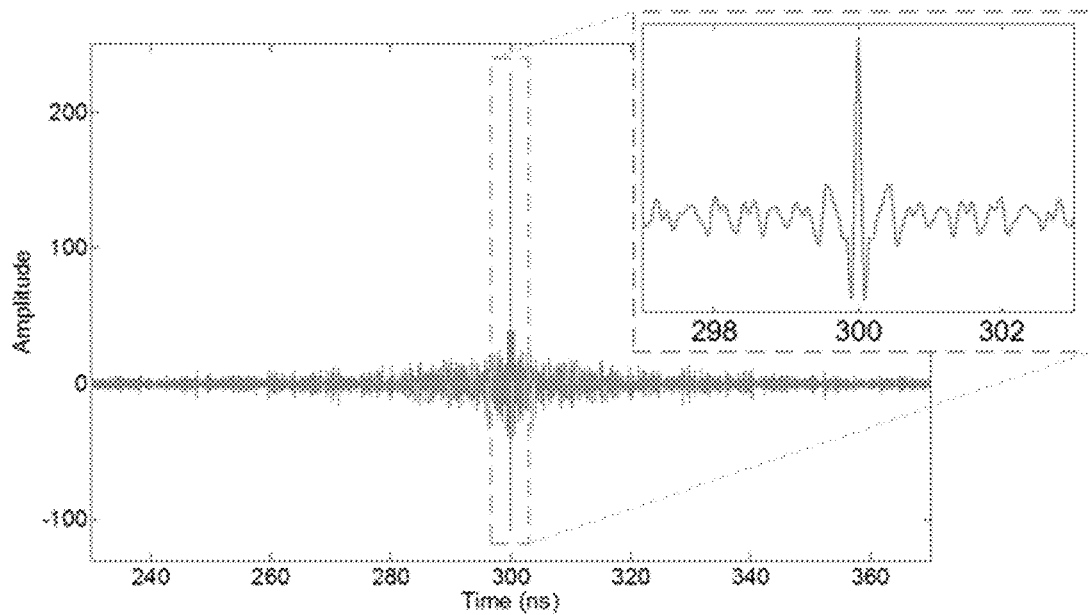
FIG. 4 shows a reconstructed (compressed) output pulse after feeding the time-reversed impulse response as cavity input.

The effects of the phase dispersion in the reverberant cavity can be "undone" to reconstruct the impulse by utilizing time-reversal (TR). This is done by transmitting the time-reversed impulse response into the cavity. Since time-reversal corresponds to phase conjugation in the frequency domain, the phase distortion is effectively cancelled out at the output to generate a compressed short pulse resembling the original impulse (~130 picoseconds in pulsewidth) as shown in FIG. 4.

Figure 5:
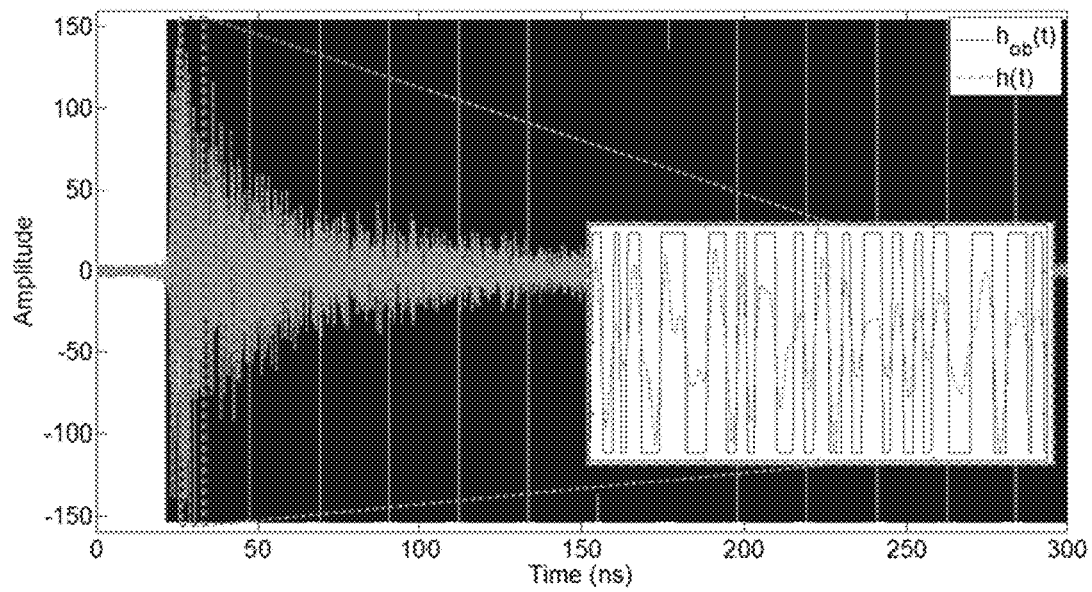
FIG. 5 shows one-bit impulse response compared with the original impulse response.

To realize high gain pulse compression, a further step is taken to modify the input waveform. As shown in FIG. 1, the impulse response decays in amplitude. This decay limits the achievable peak gain, since the input energy is not maximized. By quantizing the impulse response to a single bit by setting the waveform amplitude to be either M or –M around zero crossings (M is the maximum amplitude in the waveform), the entire waveform now has a uniform amplitude, thereby maximizing the energy in the waveform, without sacrificing much of the time-delay (phase) profile essential for time reversal reconstruction. FIG. 5 shows the one-bit impulse response in comparison with the original impulse response.

Figure 6:
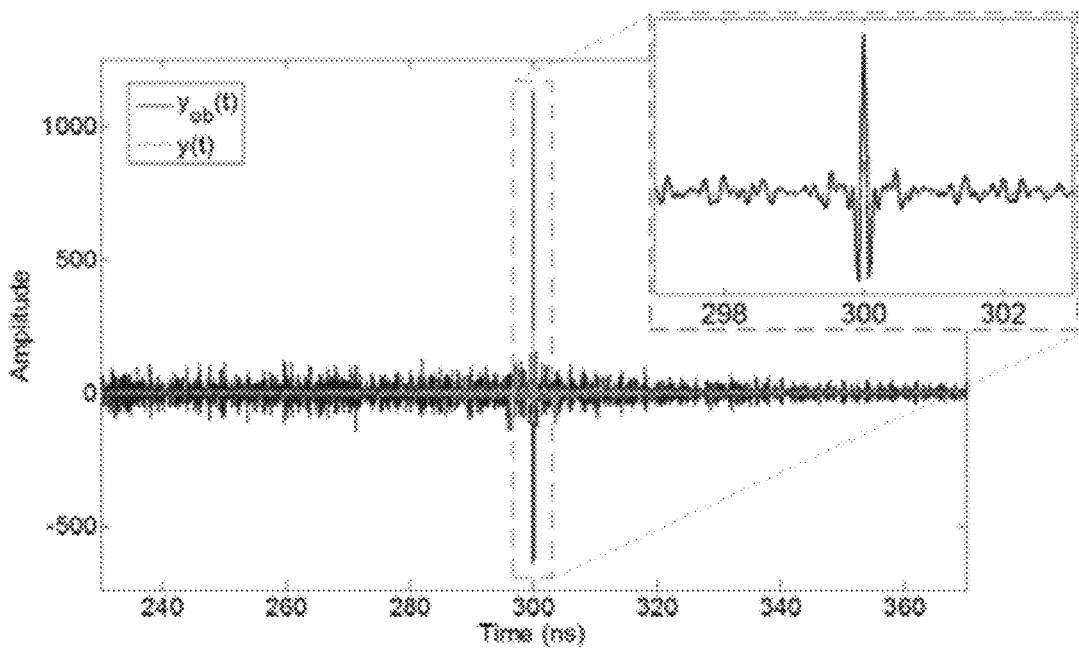
FIG. 6 shows compressed output pulse from one-bit TR input waveform (dark) in comparison to the output from the original TR waveform (light). There is a significant improvement in the output peak amplitude.
Figure 7:
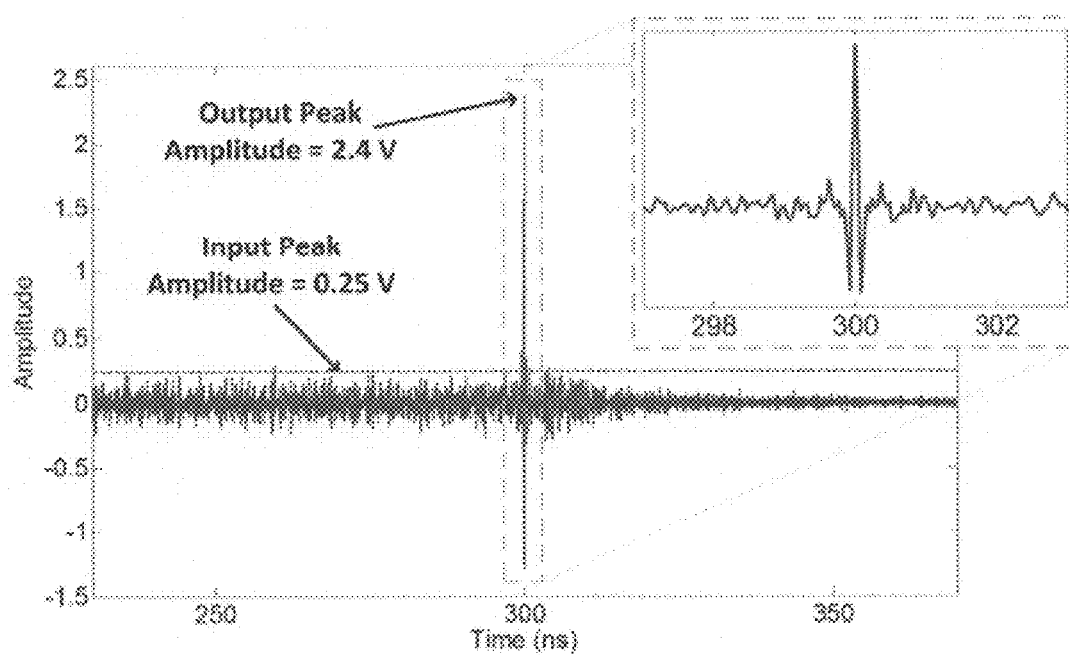
FIG. 7 shows a compressed ultrashort output pulse (the actual measured waveform amplitude in volts is shown). A peak gain of 19.6 dB is achieved.

The input waveform to the pulse compressor is now generated by time-reversing the one-bit impulse response. As a result, the compressed output pulse has significantly higher peak amplitude compared to the output when the original impulse response was used as the input waveform, as shown in FIG. 6. The compression gain (defined as the ratio of the output to input peak power levels) is 19.6 dB.

The proposed pulse compressor system not only is capable of generating ultrashort pulses but also provides a significantly higher compression gain compared to conventional pulse compression methods. It is believed that optimized designs will result in compression gain of up to 30+ dB given the same cavity size and waveform bandwidth. The reverberant cavity can also be designed to cover wider bandwidth and higher frequency bands, i.e. Ka band and above (>26 GHz). Currently the limitation is arbitrary waveform generators with limited sampling rates in their digital-to-analog convertors.

In order to implement this pulse compressor into a USHPG system that can generate extremely high peak power levels (i.e. tens of megawatts or higher), several design considerations such as high power feed and pressurization to prevent breakdown, would be included.

Referring back to FIG. 1, the operation procedure of an exemplary USHPG system is as follows. There is a calibration stage where the impulse response of the cavity is measured. The input waveform is then created from the measured impulse response via one-bit quantization and time reversal. The input waveform is then fed into the USHPG system to generate high peak ultrashort pulses. Initially the input waveform 112 is generated from an arbitrary waveform source 110 at a low power level. In the intermediate stage the input waveform goes through an amplifier 120 (or a series of amplifiers) to enhance power to a desired medium/high power input level. The amplified input waveform 122 is then fed into the reverberant cavity 130 to generate a compressed ultrashort high power pulse 132. Depending on the amplification used in the intermediate stage, the output peak power could be in the range of several kilowatts to gigawatts. For example, if the intermediate stage amplifies the input signal to a megawatt level, a 30 dB pulse compressor would generate a gigawatt level peak power. The fundamental pulse repetition rate will depend on the length of the input waveform, but ultimately depend on the amplifier (pulsed or CW). The output pulsewidth is ultimately limited by either the bandwidth or the power amplifier(s) used in the intermediate stage or the arbitrary signal source.

Referring back to FIG. 2, this cavity is a semi-2D cavity, where the waves reverberate only in the horizontal (broad) plane. In other words, the eigenmodes (resonances) are found only in the horizontal plane with no modal variation in the vertical plane. The cavity dimensions chosen here ensure an overmoded condition across the bandwidth of the impulse (2-9 GHz), i.e., the lowest eigenmode frequency is well below 2 GHz. An X-shaped scatterer is placed inside the cavity as a modemixer. Since the cavity consists of a complex propagation environment which is ray-chaotic, a slight change in the feed or mode-mixer position could result in completely different multipath trajectories between the input and output ports, producing different impulse responses which may influence the pulse compression performance.

Experiments have shown that the cavity configuration influences the achievable compression gain. Thus it may be important to carry out an "optimization" in order to determine the configuration that produces the maximum gain for a given reverberant cavity. However, even without this optimization, the statistics show that there is an expected PG value (17 dB in this case) which is still significant. Therefore, determining whether to optimize the cavity would depend on the application and operation of the pulse compressor.

Exemplary pulse compression systems have many advantages when compared to conventional pulse compression techniques. The most prominent advantage is the capability to generate ultrashort compressed pulses. Experiment has shown the generation of 85 picosecond pulse (limited by the sampling rate of the signal source used), while the exemplary cavity design described above can support as low as 60 picosecond pulsewidth.

The use of a reverberant cavity in conjunction with 1-bit TR and mode stirrers (for the purpose of exciting as many eigenmodes possible) is not known in conventional systems. Exemplary systems incorporate one-bit TR, signal processing, cavity configuration (i.e. geometry, mode stirrers, positions of input/output ports, etc), and amplifier to produce efficacious ultra-short pulse generation as a standalone system and to do so passively.

One large advantage is that no active devices are needed. Compared to conventional spark-gap based techniques which require active devices for generating ultrashort pulses, an advantage of the USHPG system is in its significantly faster pulse repetition rate (up to a few MHz) and system stability. This conventional method uses a spark-gap based source to generate ultrashort high power pulses. This conventional method would use a bank of capacitors or inductors to store energy until the voltage across the spark gap reaches high enough to cause a breakdown, which then releases the stored energy in the form of a fast high power transient (pulse).

Additionally, the USHPG system can be designed to be modular, which is difficult to realize in spark-gap based ultrashort pulse generators. That is, each component in the system (signal source, amplifier and cavity) can be designed to be removed and replaced independently. This could bring flexibility in the output power level, pulsewidth, repetition rate, etc.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method of generating a high-power Radio-Frequency ultrashort waveform comprising the steps of:
    generating an input waveform at a relatively low power level from an impulse response characteristic of a reverberant cavity via one-bit quantization and time reversal; and
    generating a compressed ultrashort pulse having a high power relative to the input waveform via feeding the input waveform into the reverberant cavity.

2. The method of claim 1, wherein feeding the input waveform into the reverberant cavity includes the step of generating an amplified input waveform of a power higher than the input waveform via feeding the input waveform into one or more amplifiers, and feeding the amplified input waveform into the reverberant cavity.

3. The method of claim 1, further comprising the step of measuring an impulse response of the cavity to obtain the impulse response characteristic of the reverberant cavity.

4. The method of claim 1, wherein the input waveform is of uniform amplitude.

5. The method of claim 1, wherein the step of generating an input waveform comprises recording an impulse response from the reverberant cavity and modifying the impulse response to have uniform amplitude using one-bit time reversal, thereby generating the input waveform.

6. An ultrashort high-power pulse generator comprising:
    a reverberant cavity assembly having an input port and output port each opening onto a hollow cavity defined by sidewalls of the assembly; and
    an arbitrary waveform generator configured to record an impulse response from the reverberant cavity and modify the impulse response to have uniform amplitude using one-bit time reversal, thereby generating an input waveform,
    wherein the output port of the reverberant cavity assembly outputs the ultrashort high-power pulse.

7. The ultrashort high-power pulse generator of claim 6, further comprising one or more signal amplifiers configured to amplify the input signal generated by the arbitrary waveform generator and feed the amplified signal into the input port of the reverberant cavity assembly.

8. The ultrashort high-power pulse generator of claim 6, wherein the reverberant cavity assembly is a semi-2D cavity.

9. The ultrashort high-power pulse generator of claim 6, wherein the reverberant cavity is configured to cause waves that reverberate only in a plane parallel to a breadth of the hollow cavity and perpendicular to a thickness of the hollow cavity.

10. The ultrashort high-power pulse generator of claim 6, wherein dimensions of the hollow cavity produce an overmoded condition across a bandwidth of the input waveform.

11. The ultrashort high-power pulse generator of claim 6, wherein the reverberant cavity assembly includes an X-shaped scatterer inside the hollow cavity configured as a modemixer.

* * * * *